United States Patent
Huang

(10) Patent No.: US 8,934,238 B2
(45) Date of Patent: Jan. 13, 2015

(54) COLLAPSIBLE ELECTRONIC EQUIPMENT

(71) Applicant: Acer Incorporated, Hsichih, Taipei Hsien (TW)

(72) Inventor: Kai-Hung Huang, Taipei Hsien (TW)

(73) Assignee: Acer Incorporated, Hsichih, Taipei Hsien (TW)

( * ) Notice: Subject to any disclaimer, the term of this patent is extended or adjusted under 35 U.S.C. 154(b) by 178 days.

(21) Appl. No.: 13/751,310

(22) Filed: Jan. 28, 2013

(65) Prior Publication Data
US 2014/0022714 A1   Jan. 23, 2014

(30) Foreign Application Priority Data
Jul. 20, 2012   (TW) .............................. 101126166 A

(51) Int. Cl.
*G06F 1/16*   (2006.01)
*H05K 5/02*   (2006.01)

(52) U.S. Cl.
CPC ............ *H05K 5/0226* (2013.01); *G06F 1/1616* (2013.01); *G06F 1/1679* (2013.01); *G06F 1/1681* (2013.01)
USPC .................................................... 361/679.55

(58) Field of Classification Search
USPC ............ 361/679.01, 679.55; 312/271; 345/87
See application file for complete search history.

(56) References Cited

U.S. PATENT DOCUMENTS

| | | | | |
|---|---|---|---|---|
| 5,847,685 A * | 12/1998 | Otsuki | ............................ | 345/87 |
| 6,053,589 A * | 4/2000 | Lin | ............................. | 312/271 |
| 7,142,418 B2 | 11/2006 | Numano | | |
| 7,566,043 B2 * | 7/2009 | Chen | ............................ | 248/616 |
| 7,639,477 B2 * | 12/2009 | Ikunami | ................... | 361/679.01 |
| 7,929,292 B2 * | 4/2011 | Li et al. | .................... | 361/679.46 |
| 8,106,789 B2 | 1/2012 | Yang et al. | | |
| 8,792,237 B2 * | 7/2014 | Guo | ......................... | 361/679.59 |
| 2008/0198505 A1 * | 8/2008 | Chuang | ...................... | 360/98.01 |
| 2014/0009874 A1 * | 1/2014 | Huang | ..................... | 361/679.01 |

FOREIGN PATENT DOCUMENTS

TW   I363953 B   5/2012

OTHER PUBLICATIONS

TW Office Action dated Jun. 20, 2014.

* cited by examiner

*Primary Examiner* — Lisa Lea Edmonds
(74) *Attorney, Agent, or Firm* — McClure, Qualey & Rodack, LLP

(57) ABSTRACT

A collapsible electronic equipment includes a first part, a shaft, a second part, a retaining element, and a blocking element. The first part pivots on the second part via the shaft. The retaining element is disposed on the shaft, and the blocking element is movably disposed on the second part. When the blocking element is abutted against the retaining element, a relative position between the first part and the second part is maintained.

9 Claims, 7 Drawing Sheets

COLLAPSIBLE ELECTRONIC EQUIPMENT

CROSS-REFERENCE TO RELATED APPLICATIONS

This Application claims priority of Taiwan Patent Application No. 101126166, filed on Jul. 20, 2012, the entirety of which is incorporated by reference herein.

BACKGROUND OF THE INVENTION

1. Field of the Invention

The present invention relates to an electronic equipment, and in particular to a collapsible electronic equipment.

2. Description of the Related Art

In recent years, since touch displays are very popular, users are accustomed to controlling electronic equipment by touching. Thus, many notebook computers are provided with touch functions via touch displays.

However, when the touch display is pressed by touching, a conventional hinge of the notebook computer cannot bear the pressure of the touching, and thus an inclined angle between the touch display and a mainframe of the notebook computer may be changed. This hinders the usage of the notebook computer.

The above problem may be solved by increasing torsion of the hinge. However, this causes difficulty in rotating the touch display relative to the mainframe, causing a user to use two hands just to open the touch display. This also hinders the usage of the notebook computer.

BRIEF SUMMARY OF THE INVENTION

To solve the problems of the prior art, the object of the present invention provides a collapsible electronic equipment opened easily, which supports a display thereof to be kept in an inclined angle when the display is touched.

The present invention provides a collapsible electronic equipment including a first part, a shaft, a second part, a retaining element, and a blocking mechanism. The first part may be a display, and the second part may be a mainframe. The shaft is disposed on the first part. The second part is disposed on the shaft, and is rotatable relative to the first part via the shaft. The retaining element is disposed on the shaft. The blocking mechanism includes a blocking element and a driving element. The blocking element is movably disposed on the second part. The driving element is for moving the blocking element. When the first part is rotatable relative to the second part, the blocking element is separated from the retaining element. Moreover, when the driving element moves the blocking element to abut itself against the retaining element, the blocking element stops the retaining element from rotating, and a relative position between the first part and the second part is maintained.

In conclusion, according to the collapsible electronic equipment of the present invention, since the inclined angle of the first part relative to the second part is maintained by the blocking element abutting against the retaining element, a user may control the first part with the inclined angle by touching. Moreover, when the blocking element is separated from the retaining element, the first part is rotated relative to the second part easily.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
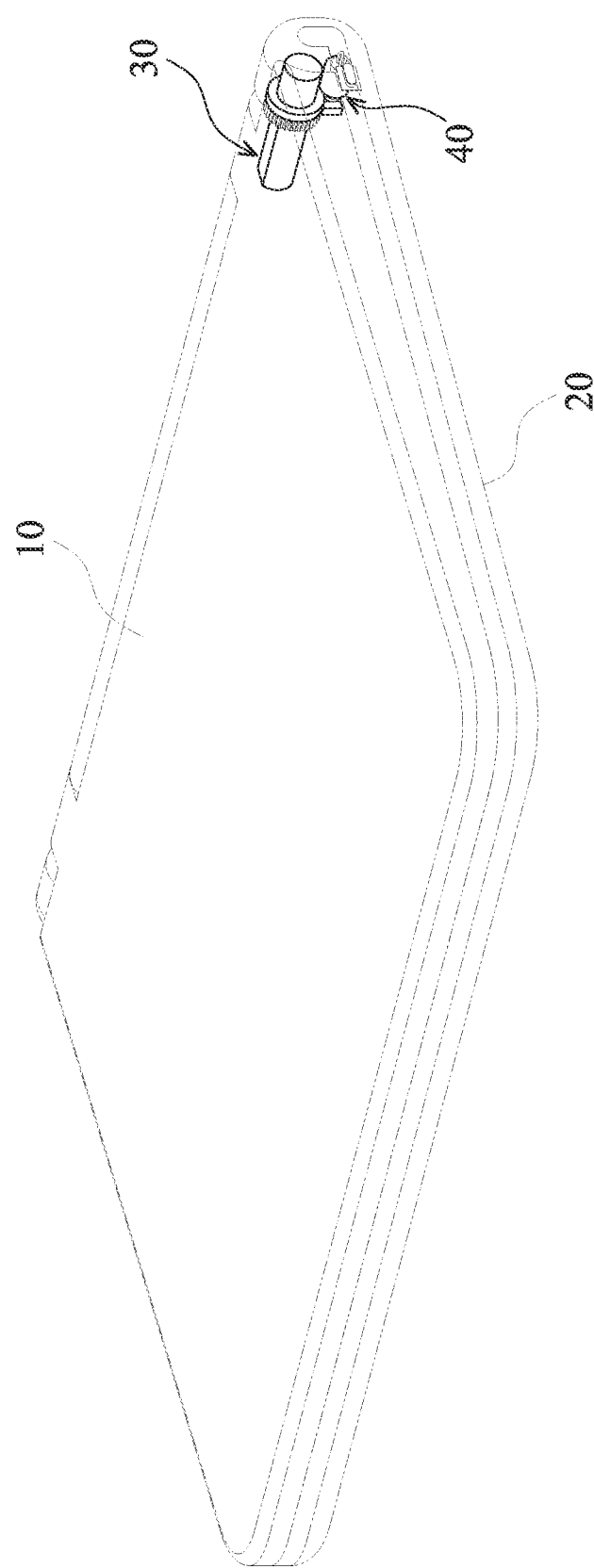
FIG. 1 is a perspective view of a collapsible electronic equipment according to the present invention.

FIG. 1 is a perspective view of a collapsible electronic equipment 1 according to the present invention. The collapsible electronic equipment 1 may be a notebook computer. The collapsible electronic equipment 1 includes a first part 10, a second part 20, a hinge mechanism 30, and a blocking mechanism 40. The first part 10 is a display, such as a touch display. The second part 20 is a mainframe including electronic elements, such as a keyboard, a touch panel, a touch display, a central processing unit (CPU), a memory, and a motherboard. The hinge mechanism 30 is disposed on the first part 10, and the second part 20 is pivoted on the hinge mechanism 30. The first part 10 is rotated relative to the second part 20 by the hinge mechanism 30.

Figure 2:
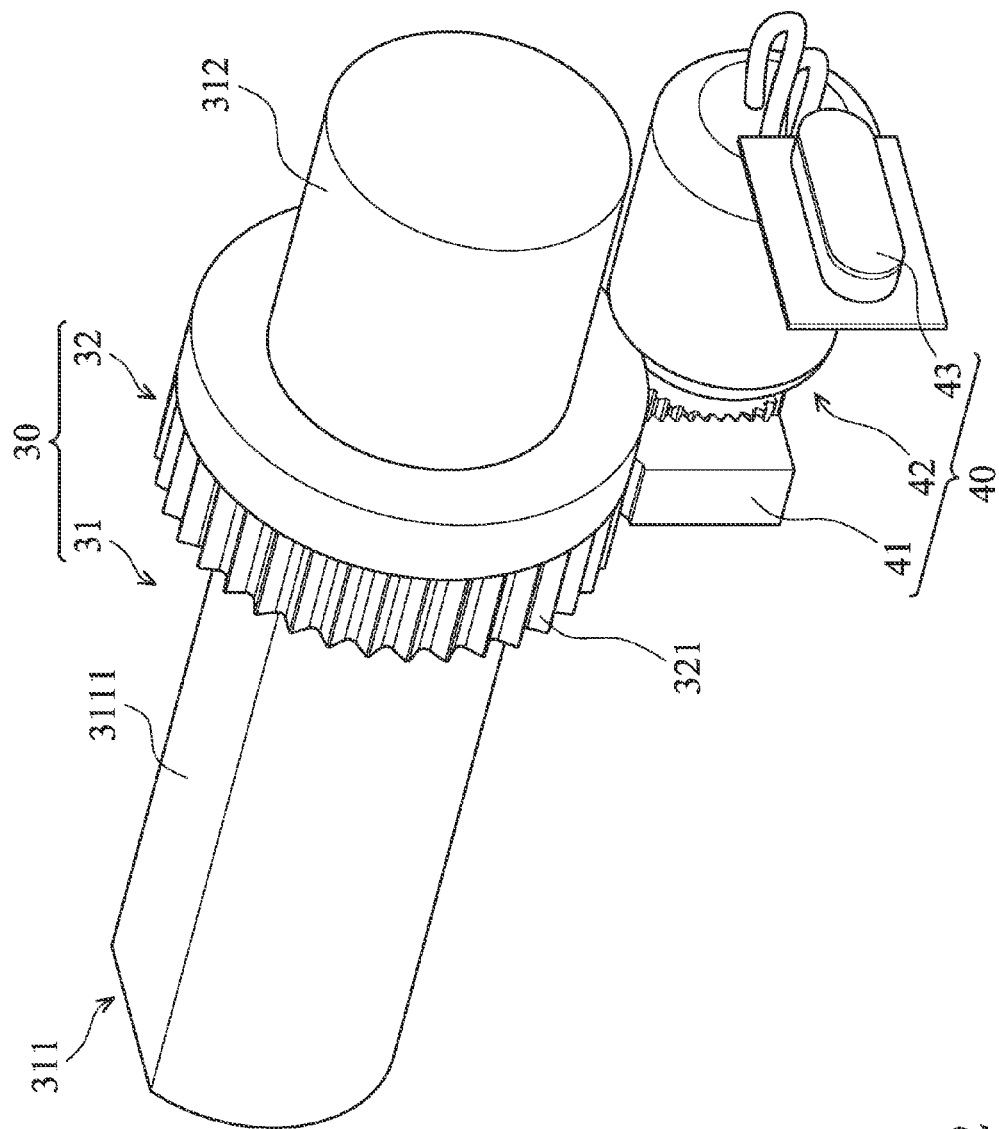
FIG. 2 is a perspective view of a hinge mechanism and a blocking mechanism according to the present invention.
Figure 3:
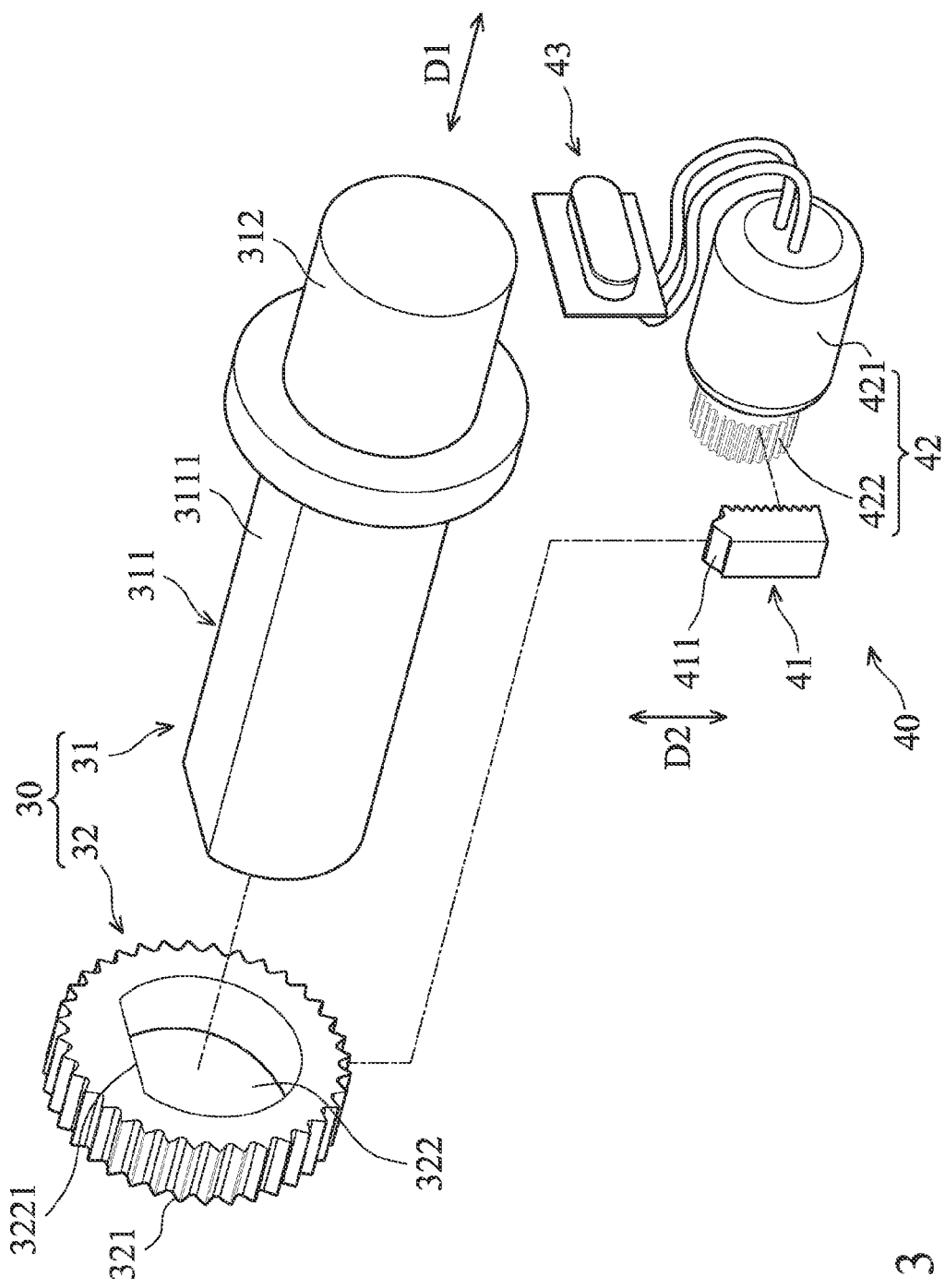
FIG. 3 is an explored view of the hinge mechanism and the blocking mechanism according to the present invention.

FIG. 2 is a perspective view of the hinge mechanism 30 and the blocking mechanism 40 according to the present invention. FIG. 3 is an explored view of the hinge mechanism 30 and the blocking mechanism 40 according to the present invention. The hinge mechanism 30 includes a shaft 31 and a retaining element 32. The shaft 31 is disposed on the first part 10, and includes a retaining portion 311 and a pivoting portion 312. The retaining portion 311 is connected to the pivoting portion 312, and the retaining portion 311 and the pivoting portion 312 are extended along an extending direction D1.

A side wall of the retaining portion 311 has a tangential plane 3111, and the first part 10 is fixed on the retaining portion 311. The pivoting portion 312 may be a cylindrical structure, and the second part 20 is pivoted on the pivoting portion 312. The second part 20 is rotatable relative to the first part 10 via the shaft 31. The pivoting portion 312 of the shaft 31 provides a torsion between the first part 10 and the second part 20 to prevent the first part 10 from falling down quickly when the first part 10 is inclined relative to the second part 20.

The retaining element 32 is disposed on the shaft 31. The retaining element 32 may be a gear with a plurality of teeth portions 321 and a retaining hole 322. The teeth portion 321 is annularly arranged on an outer side wall of the retaining element 32. The shape of the retaining hole 322 corresponds to the side wall of the retaining portion 311, and the retaining hole 322 has a surface 3221 corresponding to the tangential plane 3111 of the retaining portion 311. Therefore, when the retaining portion 311 passes through the retaining element 32 along the extending direction D1, the retaining element 32 is fixed on the retaining portion 311.

The blocking mechanism 40 includes a blocking element 41, a driving element 42 and a switch element 43. The blocking element 41 is movably disposed on the second part 20. The blocking element 41 is a gear rack extending along a moving direction D2. The moving direction D2 is perpendicular to the extending direction D1. Moreover, an end of the blocking element 41 has a blocking portion 411.

The driving element 42 is for moving the blocking element 41 along the moving direction D2. The driving element 42 includes a motor 421 and a gear element 422. The gear element 422 is disposed on the motor 421, and is engaged with the blocking element 41. The switch element 43 may be disposed on the second part 20 near an edge of the driving element 42, and thus the wire layout of the collapsible electronic equipment 1 may be simplified. In another embodiment, the switch element 43 may be disposed on a front edge of the first part 10 to make the operation of the user more convenient.

The switch element 43 is coupled to the motor 421. The switch element 43 generates a driving signal according to a touching event, and the driving element 42 receives the driving signal and drives the motor 421 and the gear element 422 to rotate according to the driving signal. Since the gear element 422 is engaged with the blocking element 41, the driving element 42 drives the blocking element 41 to move along the moving direction D2 to force the blocking element 41 to separate from the retaining element 32 and to make the retaining element 32 rotatable.

When the switch element 43 stops to generate the driving signal, the driving element 42 moves the blocking element 41 to abut itself against the retaining element 32. Then, the blocking portion 41 of the blocking element 41 is engaged between the two adjacent teeth portions 321 to stop the retaining element 32 from rotating.

In another embodiment, the blocking mechanism 40 may exclude the switch element 43, and the driving element 42 may exclude the motor 421 and/or gear element 422. The driving element 42 may include connecting rods, and thus the driving element 42 is controlled manually to drive the blocking element 41 from moving.

Figure 4:
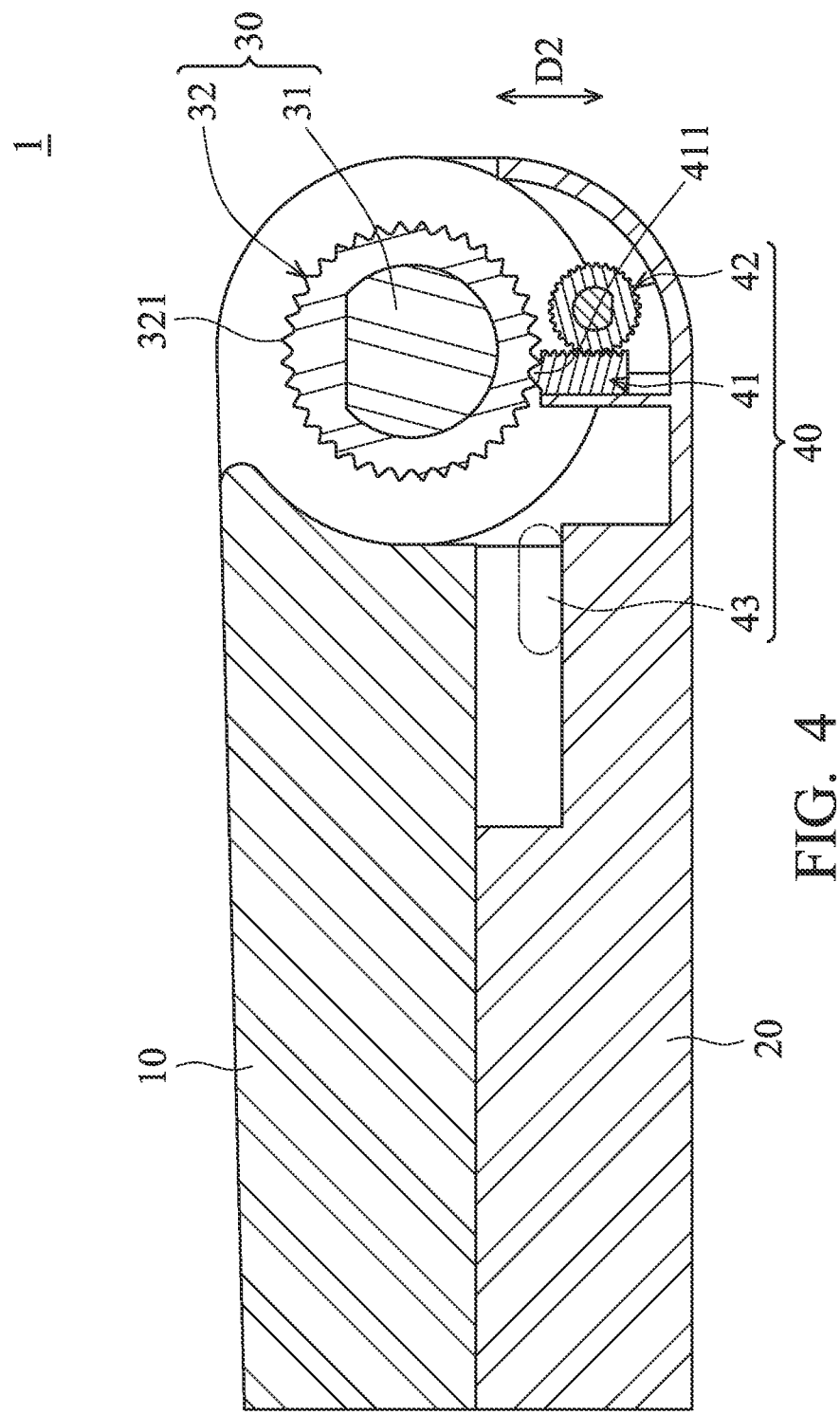
FIG. 4 is a cross-sectional view of the collapsible electronic equipment according to the present invention.

FIG. 4 is a cross-sectional view of the collapsible electronic equipment 1 according to the present invention. The first part 10 covers the second part 20, and the blocking element 41 is located at a first position. Thus, since the switch element 43 is not enabled, driving element 42 controls the blocking portion 411 of the blocking element 41 to engage between the two adjacent teeth portions 321 to stop the retaining element 32 from rotating. Since the retaining element 32 cannot be rotated, the first part 10 is not rotated easily relative to the second part 20. Thus, the first part 10 and second part 20 are prevented from opening when the collapsible electronic equipment 1 is carried.

Figure 5:
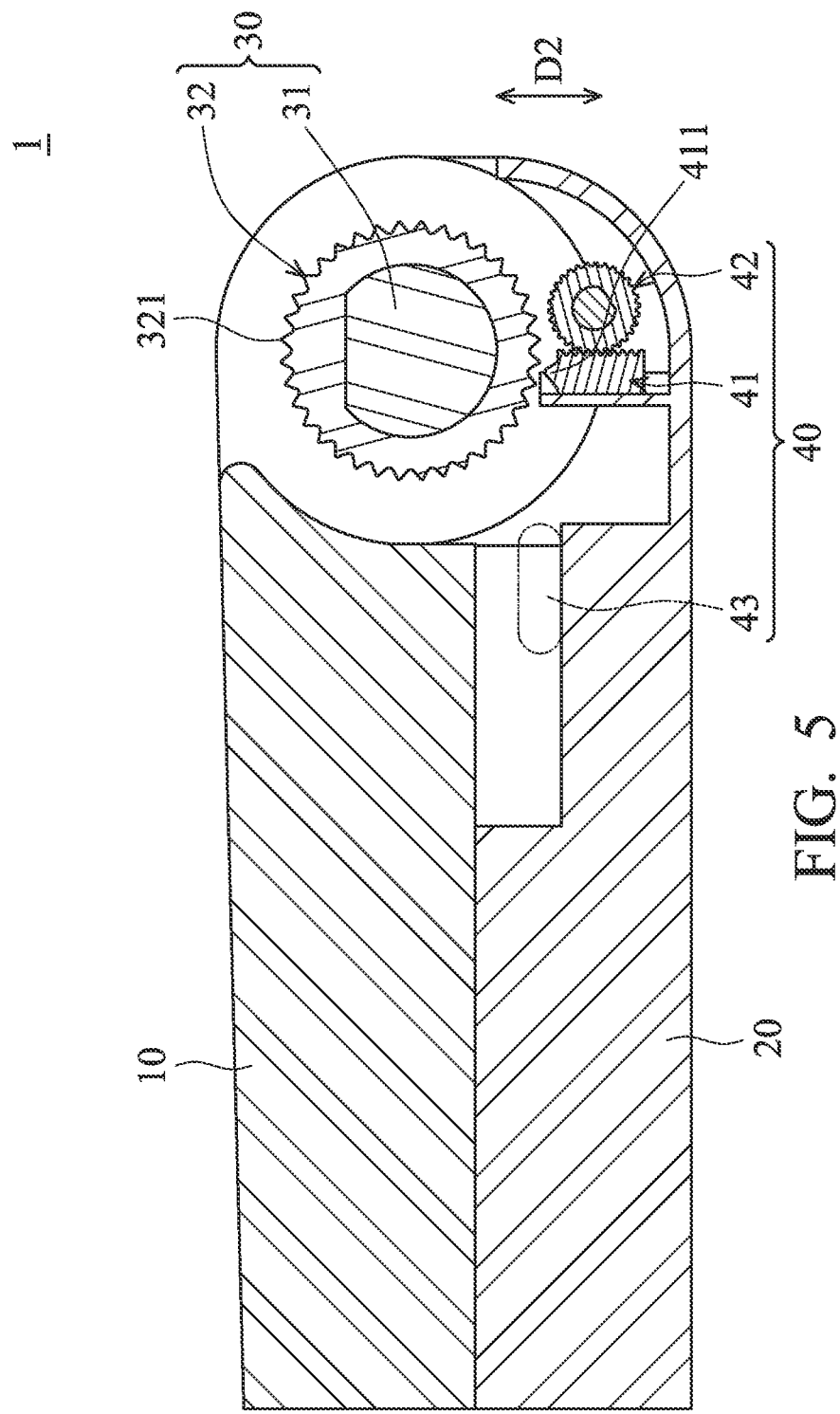
FIGS. 5 to 7 are schematic views of the collapsible electronic equipment in a moving process according to the present invention.
Figure 6:
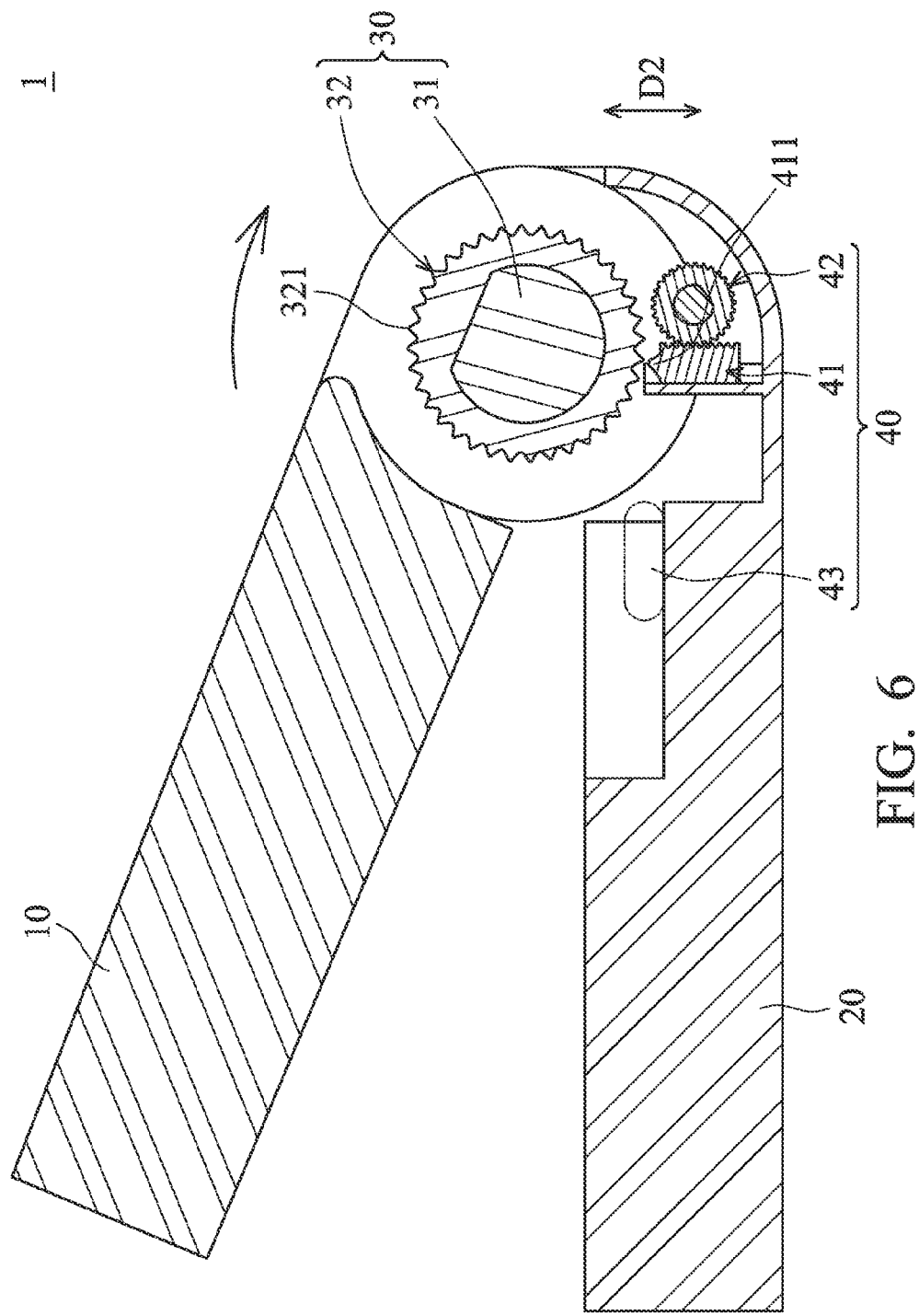

As shown in FIG. 5, the first part 10 may be opened relative to the second part 20 by pressing the switch element 43 to generate a driving signal. After the driving element 42 receives the driving signal, the blocking element 41 is moved to force the blocking portion 411 of the blocking element 41 to separate from the two adjacent teeth portions 321 of the retaining element 32, and moved to a second position from the first position. Since the blocking element 41 is separated from the retaining element 32, the retaining element 32 is rotatable relative to the second part 20, and the first part 10 is rotatable relative to the second part 20 (as shown in FIG. 6).

In the embodiment, when the first part 10 is rotated, a proper torsion between the first part 10 and the second part 20 is provided by the pivoting portion 312 of the shaft 31, and thus the first part 10 is rotated easily by a user.

Figure 7:
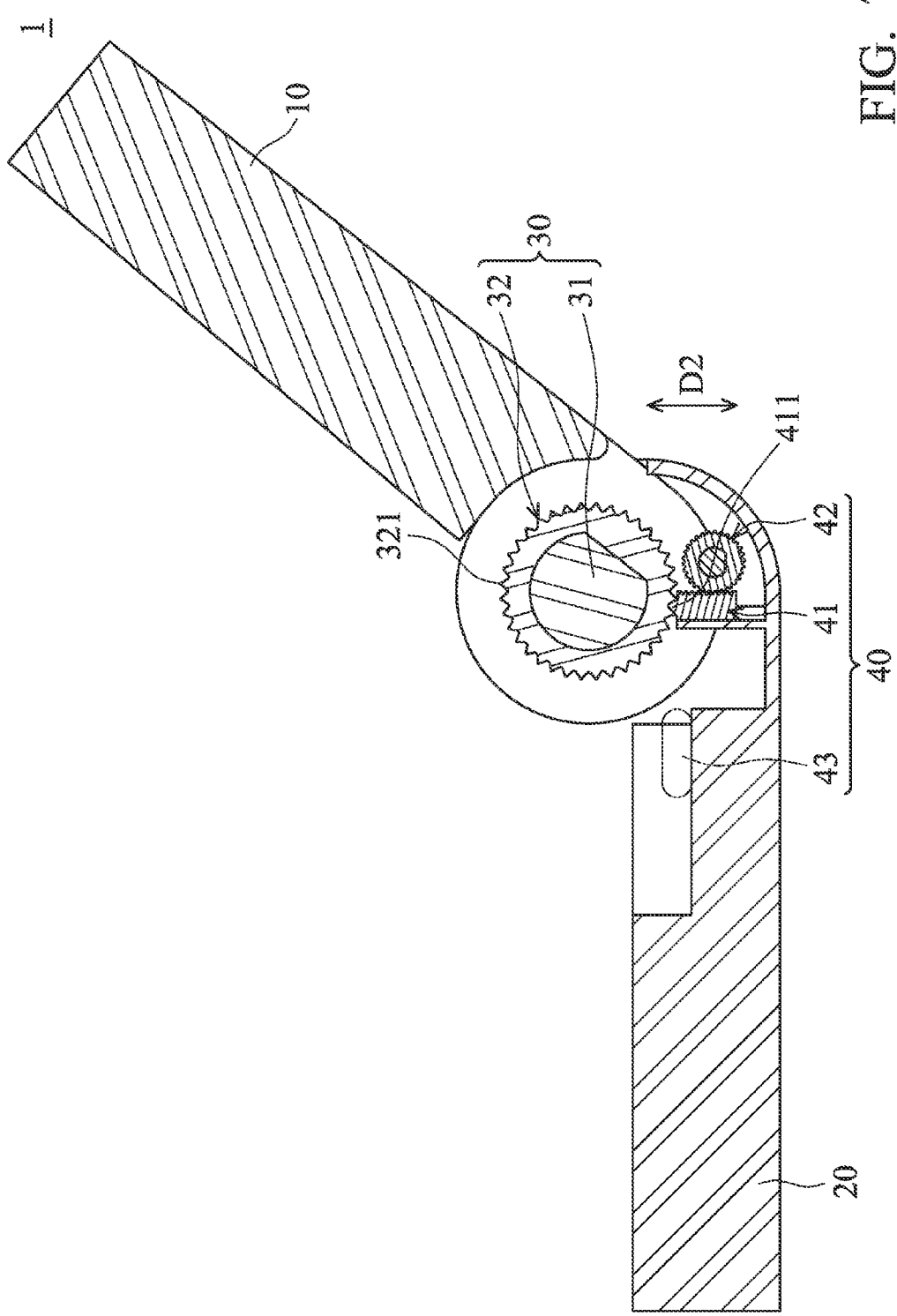

As shown in FIG. 7, when the first part 10 is rotated to an inclined angle relative to the second part 20, the switch element 43 may be released to stop generating the driving signal. Then, the driving element 42 moves the blocking element 41 from the second position to the first position to force the blocking element 41 to abut against the retaining element 32.

Since the blocking portion 411 of the blocking element 41 is engaged between the two adjacent teeth portions 321 of the retaining element 32, the blocking element 41 stops the retaining element 32 from rotating, and a relative position between the first part 10 and the second part 20 is fixed. Although the first part 10 is pressed by touching, the inclined angle of the first part 10 relative to the second part 20 is maintained.

In conclusion, according to the collapsible electronic equipment of the present invention, since the inclined angle of the first part relative to the second part is maintained by the blocking element abutting against the retaining element, a user may control the first part with the inclined angle by touching. Moreover, when the blocking element is separated from the retaining element, the first part is rotated relative to the second part easily.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A collapsible electronic equipment, comprising:
   a first part;
   a shaft disposed on the first part;
   a second part, disposed on the shaft, movable relative to the first part via the shaft;
   a retaining element disposed on the shaft; and
   a blocking mechanism, comprising:
   a blocking element movably disposed on the second part; and
   a driving element for moving the blocking element,
   wherein when the first part is movable relative to the second part, the blocking element is separated from the retaining element,
   wherein when the driving element drives the blocking element to force the blocking element to abut itself against the retaining element, the blocking element stops the retaining element from rotating, and a relative position between the first part and the second part is maintained.

2. The collapsible electronic equipment as claimed in claim 1, wherein the retaining element is a gear with a plurality of teeth portions.

3. The collapsible electronic equipment as claimed in claim 2, wherein the blocking element has a blocking portion, and when the blocking element is abutted against the retaining element, the blocking portion is engaged between the two adjacent teeth portions to stop the retaining element from rotating.

4. The collapsible electronic equipment as claimed in claim 1, wherein the driving element comprises a motor and a gear element, and the blocking element is a gear rack, and the gear element is disposed on the motor and engaged with the blocking element.

5. The collapsible electronic equipment as claimed in claim 1, wherein the blocking mechanism further comprises a switch element coupled to the motor, wherein the switch element generates a driving signal according to a touching event, and after the driving element receives the driving signal, the blocking element is moved and separated from the retaining element to force the retaining element to rotate.

6. The collapsible electronic equipment as claimed in claim 5, wherein when the switch element is stopped to generate the driving signal, the driving element drives the blocking element to abut itself against the retaining element and to stop the retaining element from rotating.

7. The collapsible electronic equipment as claimed in claim 5, wherein the switch element is disposed on a side of the first part or the second part.

8. The collapsible electronic equipment as claimed in claim 1, wherein the shaft provides a torsion between the first part and the second part.

9. The collapsible electronic equipment as claimed in claim 1, wherein the first part is a display, and the second part is a mainframe.

* * * * *